US012724093B2

(12) United States Patent
Babashah et al.

(10) Patent No.: US 12,724,093 B2
(45) Date of Patent: Sep. 1, 2026

(54) SENSOR DEVICE COMPRISING A SOURCE OF FLUORESCENCE COUPLED TO A FLUORESCENCE COLLECTOR AND MAGNETOMETER COMPRISING SAID DEVICE

(71) Applicant: KWAN-TEK, Ploemeur (FR)

(72) Inventors: Hossein Babashah, Chavannes-près-Renens (CH); Christophe Galland, Belmont sur Lausanne (CH); François Beato, Lorient (FR); Mathis Autant, Lorient (FR)

(73) Assignee: KWAN-TEK, Ploemeur (FR)

( * ) Notice: Subject to any disclaimer, the term of this patent is extended or adjusted under 35 U.S.C. 154(b) by 157 days.

(21) Appl. No.: 18/716,919

(22) PCT Filed: Dec. 7, 2022

(86) PCT No.: PCT/EP2022/084861
§ 371 (c)(1),
(2) Date: Jun. 5, 2024

(87) PCT Pub. No.: WO2023/104921
PCT Pub. Date: Jun. 15, 2023

(65) Prior Publication Data

US 2025/0044384 A1 Feb. 6, 2025

(30) Foreign Application Priority Data

Dec. 9, 2021 (EP) .................................... 21306733

(51) Int. Cl.

| | |
|---|---|
| ***G01R 33/26*** | (2006.01) |
| ***F21V 8/00*** | (2006.01) |
| ***G01N 24/00*** | (2006.01) |
| ***G01R 33/32*** | (2006.01) |
| ***G01R 33/34*** | (2006.01) |

(52) U.S. Cl.
CPC ........... *G01R 33/26* (2013.01); *G01N 24/006* (2013.01); *G01R 33/323* (2013.01); *G01R 33/34* (2013.01); *G02B 6/0005* (2013.01)

(58) Field of Classification Search
CPC ...... G01R 33/26; G01R 33/323; G01R 33/34; G01R 33/60; G01R 33/032; G01R 33/24; G02B 6/0005; G01N 24/10; G01N 24/006
See application file for complete search history.

(56) References Cited

U.S. PATENT DOCUMENTS

| | | | | |
|---|---|---|---|---|
| 10,330,744 B2 | 6/2019 | Luzod | | |
| 2023/0296380 A1* | 9/2023 | McBride | ................ | G01C 19/62<br>324/300 |
| 2024/0187009 A1* | 6/2024 | Tsuji | ...................... | G01C 19/58 |

FOREIGN PATENT DOCUMENTS

| | | |
|---|---|---|
| DE | 102019119212 A1 | 1/2021 |
| WO | 2023104921 A1 | 6/2023 |

OTHER PUBLICATIONS

Foreign Communication from a Related Counterpart Application, International Search Report and Written Opinion dated Mar. 21, 2023, International Application No. PCT/EP2022/084861 filed on Dec. 7, 2022.

(Continued)

*Primary Examiner* — Rishi R Patel
(74) *Attorney, Agent, or Firm* — Conley Rose, P.C.

(57) ABSTRACT

A sensor device is described. The sensor device comprises a source of fluorescence, wherein said fluorescence is function of a physical phenomenon to be sensed and wherein said fluorescence is generated in response to an excitation provided by a source of excitation; a collector for collecting said fluorescence; a reflector placed around said source of fluorescence to reflect said fluorescence towards said collector, wherein said reflector is provided with an opening at its vertex, the source of fluorescence being arranged within said (Continued)

reflector to sense said physical phenomenon through said opening. A magnetometer comprising said sensor device is also disclosed.

15 Claims, 11 Drawing Sheets

(56) References Cited

OTHER PUBLICATIONS

Kuwahata, et al., "Magnetometer with nitrogen-vacancy center in a bulk diamond for detecting magnetic nanoparticles in biomedical applications", Scientific Reports, vol. 10, No. 1, Feb. 12, 2020, 9 pages, XP055907958, DOI: 10.1038/s41598-020-59064-6, Retrieved from the Internet: URL:https://www.nature.com/articles/s41598-020-59064-6.pdf.

Zhang, et al., "Diamond Nitrogen-Vacancy Center Magnetometry: Advances and Challenges", arxiv.org, Cornell University Library, 201 Olin Library Cornell University Ithaca, NY 14853, Oct. 20, 2020, XP081790927, Section 4.3, 17 pages.

Duan, et al., "Enhancing fluorescence excitation and collection from the nitrogen-vacancy center in diamond through a micro-concave mirror", arxiv.org, Cornell University Library, 201 Olin Library Cornell University Ithaca, NY 14853, Jul. 27, 2018, XP081092132, DOI: 10.1063/1.5037807, 6 pages.

* cited by examiner din h dt

SENSOR DEVICE COMPRISING A SOURCE OF FLUORESCENCE COUPLED TO A FLUORESCENCE COLLECTOR AND MAGNETOMETER COMPRISING SAID DEVICE

CROSS-REFERENCE TO RELATED APPLICATIONS

The present application is a filing under 35 U.S.C. 371 as the National Stage of International Application No. PCT/EP2022/084861, filed Dec. 7, 2022, entitled "SENSOR DEVICE COMPRISING A SOURCE OF FLUORESCENCE COUPLED TO A FLUORESCENCE COLLECTOR AND MAGNETOMETER COMPRISING SAID DEVICE," which claims priority to European Application No. 21306733.3 filed with the European Patent Office on Dec. 9, 2021, both of which are incorporated herein by reference in their entirety for all purposes.

TECHNICAL FIELD

A sensor device comprising a source of fluorescence coupled to a fluorescence collector is described. Applications include magnetometry, in which the source of fluorescence can be a nitrogen-vacancy diamond. A magnetometer comprising a sensor device is also described.

BACKGROUND

Magnetometers based on the probing of the energy level differences in Nitrogen Vacancy (NV) color centers in diamonds are a promising technology, for example for non-destructive testing (NDT). Micron-scale resolution has been demonstrated in so-called wide-field magnetic imaging schemes where an NV diamond crystal is imaged by a microscope objective. However, the wide-field NV microscope solution is not suited for industrial applications such as imaging of defects of steel bars in production or imaging of material defects in e.g. oil-and-gas casing, due to the presence of a microscope objective that requires a precise and stable alignment with the diamond crystal. Other examples of applications of NDT in which microscope objectives may be at a disadvantage include aeronautics, nuclear power plants, underground and underwater pipes, etc. . . . .

It has been proposed to use an optical fiber to excite an NV diamond crystal and to collect the resulting fluorescence. Indeed, coupling diamonds with NV centers to fibers can make them good candidates for performing magnetometry in challenging environments. An NV-based magnetometer in which an optical fiber is used is described by Chatzidrosos, Georgios, et al. "Fiberized Diamond-Based Vector Magnetometers." Frontiers in Photonics, 2021.

Due to the high refractive index of the diamond, the collection efficiency that is defined as the ratio of collected fluorescence to the total fluorescence emitted by the NV centers of a diamond is small. This will degrade the minimum magnetic field sensitivity of such a sensor since it is inversely proportional to the square root of detected photons from the NV centers. This may hamper the application of NV diamonds to high precision magnetometry. The expected collection efficiency can be as low as 4% when using a high numerical aperture air objective. This situation worsens to less than 0.1% in the case where the NV centers red fluorescence is intended to be coupled directly to fiber.

It is therefore desirable to increase the collection efficiency.

SUMMARY

The project leading to this patent application has received funding from the European Union's Horizon 2020 research and innovation programme under the Marie Skłodowska-Curie grant agreement No 754354.

The scope of protection is set out by the claims.

A first aspect concerns a sensor device comprising a source of fluorescence wherein said fluorescence is function of a physical phenomenon to be sensed and wherein said fluorescence is generated in response to an excitation provided by a source of excitation;

a collector for collecting said fluorescence;

a reflector placed around said source of fluorescence to reflect said fluorescence towards said collector, wherein said reflector is provided with an opening at its vertex, the source of fluorescence being arranged within said reflector to sense said physical phenomenon through said opening.

According to an embodiment, said source of fluorescence comprises a nitrogen-vacancy diamond, said physical phenomenon is a magnetic field and said excitation is light in the green spectrum produced by an excitation light source.

According to an embodiment, said diamond has the shape of a solid-immersion lens.

According to an embodiment, said source further comprises a lens associated with said nitrogen-vacancy diamond, wherein said lens has the shape of a solid-immersion lens.

According to an embodiment, a side of the diamond facing said opening is coated with a reflective coating, a material of said reflective coating being selected so as to reflect both fluorescence and excitation light.

According to an embodiment, said coating comprises copper.

According to an embodiment, said collector is a first optical fiber.

According to an embodiment, said first optical fiber is arranged to channel said excitation light to said nitrogen-vacancy diamond.

According to an embodiment, said sensor device further comprises a second optical fiber distinct from said first optical fiber, wherein said second optical fiber is arranged to channel said excitation light to said nitrogen-vacancy diamond.

According to an embodiment, said second optical fiber is arranged to illuminate said nitrogen-vacancy diamond from a direction substantially perpendicular to the optical axis of the reflector.

According to an embodiment, said second optical fiber is arranged to illuminate said solid immersion lens at an angle of substantially 30° compared to the optical axis of the solid immersion lens.

According to an embodiment, said reflector has the shape of a truncated cone or the shape of a truncated standard surface.

According to an embodiment, when the reflector has the shape of a truncated cone, the diameter of the core of the first optical fiber is substantially the same as the input diameter of said truncated cone.

According to an embodiment, said sensor device further comprises a microwave resonator placed on a substrate, said substrate comprising an opening substantially aligned with the opening of the reflector.

A second aspect concerns a magnetometer comprising a sensor device according to one of the embodiments of the first aspect.

Some embodiments enhance collection efficiency through the combination of a reflector for coupling the source of fluorescence to the collector.

Some embodiments improve the excitation efficiency through the use of reflective coating—this allows lower required power of an excitation light source (e.g. a laser).

Some embodiments propose the use of a reflector with a simple conical shape, allowing easy manufacturing.

The designs described herein are scalable and can be used for any size of a high refractive index media, such as diamond, as needed by a specific application.

Some embodiments use separate fibers to convey excitation and collect fluorescence, which can further enhance the simplicity of the final sensor device avoiding the need for a dichroic filter.

BRIEF DESCRIPTION OF THE DRAWINGS

Example embodiments will be more fully understood from the detailed description provided herein and the accompanying drawings, which are given by way of illustration only.

It should be noted that these figures are intended to illustrate the general characteristics of methods, structure and/or materials utilized in the described exemplary embodiments. The drawings are not to scale and should not be interpreted as limiting the range of values or properties encompassed by the exemplary embodiments.

DETAILED DESCRIPTION

Various exemplary embodiments will now be described more fully with reference to the accompanying drawings. However, specific structural and functional details disclosed herein are merely representative for purposes of describing example embodiments. The exemplary embodiments may be embodied in many alternate forms and should not be construed as limited to only the embodiments set forth herein. It should be understood that there is no intent to limit example embodiments to the particular forms disclosed.

It should be appreciated by those skilled in the art that any functions, engines, block diagrams, flow diagrams, state transition diagrams and/or flowcharts herein represent conceptual views of illustrative circuitry embodying the principles of the exemplary embodiments. Functions, actions or steps described herein can be implemented in hardware or software or any combination thereof. If implemented in software, the functions, blocks of the block diagrams and/or flowchart illustrations can be implemented e.g. using software code executed by a processor or a processing device.

In the present description, functional blocks denoted as "means configured to perform . . . " a certain function shall be understood as functional blocks comprising circuitry that is adapted for performing or configured to perform a certain function. A means being configured to perform a certain function does, hence, not imply that such means necessarily is performing said function (at a given time instant). Moreover, any entity described herein as "means", may be implemented as one or more distinct entities or within an entity providing additional functions. When provided by a processor, the functions may be provided by a single processor or several processors. Moreover, the term "processor" includes one or more of a digital signal processor, remote 'cloud' processor, graphical processing units, dedicated or generic circuitry, read only memory for storing software, random access memory, and non-volatile storage.

Figure 1:
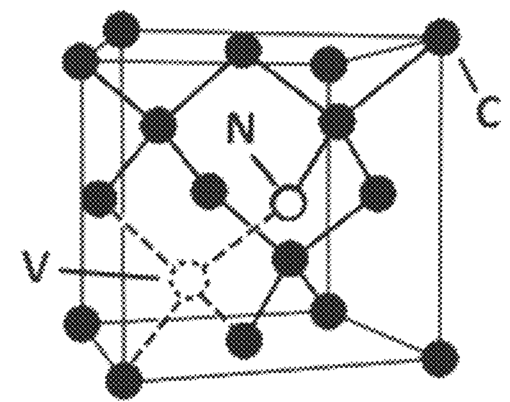
FIG. 1 is a schematic representation of a diamond crystal and its carbon atoms (C), and comprising a nitrogen atom (N) and a vacancy (V), the latter two forming an 'NV center'.

NV magnetometry is based on the use of a particular defect of the diamond crystal lattice in the solid state. The term NV (Nitrogen-Vacancy) center refers to the substitution of a carbon atom by a nitrogen atom, directly adjacent to a lattice vacancy (a missing carbon atom), as shown in FIG. 1. This defect presents energy levels and various interesting physical characteristics, which can be used in a magnetic field sensor. These measurements can also be used to determine temperatures, electric fields, strains and pressure. In particular, when a NV diamond crystal (containing millions of NV centers) is irradiated with green light (e.g. coming from a laser or a LED), it fluoresces red light with an intensity generally proportional to the irradiation.

Figure 2:
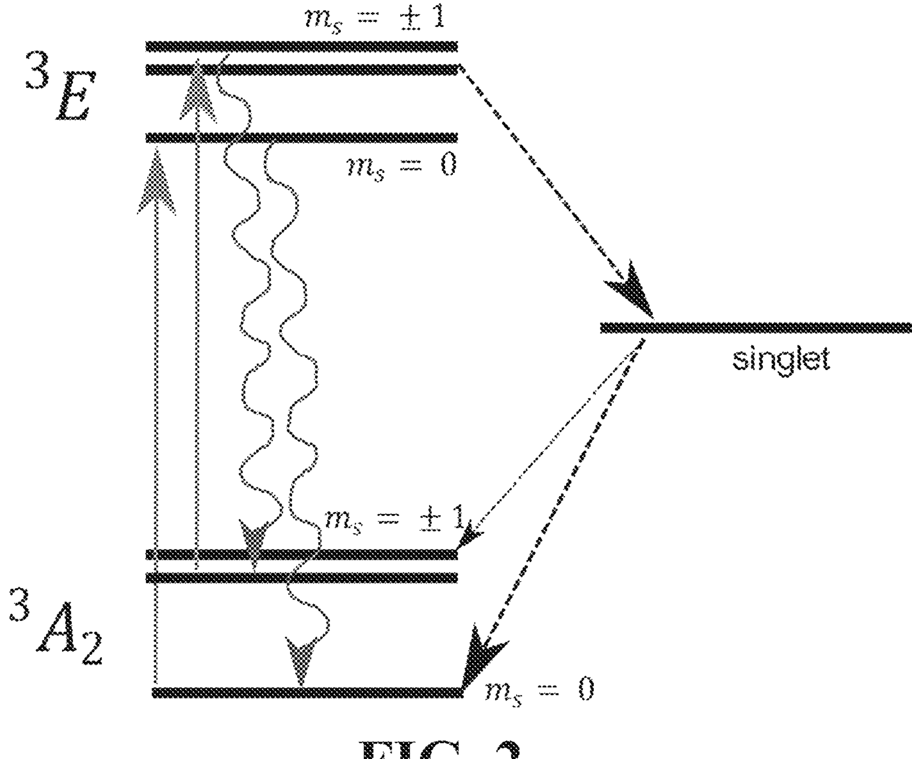
FIG. 2 is a schematic diagram of the energy levels of an NV center.

FIG. 2 is a schematic diagram of the energy levels of the NV center, and showing the ground state triplet state 3A2, the excited triplet state 3E and the singlet state. Owing to quantum mechanical selection rules, when the NV center is in the ms=0, respectively ms=±1 state, in the ground state, it tends to stay in the ms=0, respectively ms=±1, state when absorbing a green photon from the excitation light source, as shown by the two upward oriented straight arrows. Similar selection rules apply when the NV center is de-excited from the excited state to the ground state by the emission of a red fluorescence photon, as shown by the two downward oriented wobbly arrows. However, when the NV center lands in the ms=±1 levels in the excited state, it has a larger (about 7 times) probability to decay non radiatively in the singlet state than when in the ms=0 excited state. From the singlet state, the NV center returns preferentially (with twice larger probability) to the ms=0 ground state. As a result, the NV center can be optically polarized in the ms=0 ground state through the application of green excitation light. Red fluorescence is emitted owing to the radiative decay from the excited state to the ground state. This level of fluorescence varies depending on the initial spin level of the NV center in the ground state: more fluorescence is recorded when the NV center is initially in the ms=0 spin level than in the ms=±1 levels, owing to the non-radiative transitions through the singlet state in the second case.

A microwave field with a frequency around 2.87 GHz can be applied to change the spin state of the NV center in its ground state from ms=0 to ms=1 or ms=−1. When the frequency of the microwave field is resonant with the energy level difference, less red fluorescence is observed. This phenomenon is called Optically Detected Magnetic Resonance ('ODMR').

A magnetic field lifts the degeneracy between the ms=1 and ms=−1 levels. Therefore, when a magnetic field is applied to the NV center, two frequencies for which the fluorescence decreases can be observed, linearly related to the magnitude of the magnetic field:

$$f_{res} = 2.87\text{ GHz} \pm \frac{\gamma}{2\pi}B \qquad \text{(Eq. 1)}$$

where B is the magnetic field aligned with the axis of the NV center (i.e. the axis defined by the alignment of the nitrogen atom and the gap) and γ is the gyromagnetic ratio of the NV center: $\gamma/2\pi$=28 GHZ/T.

Figure 3:
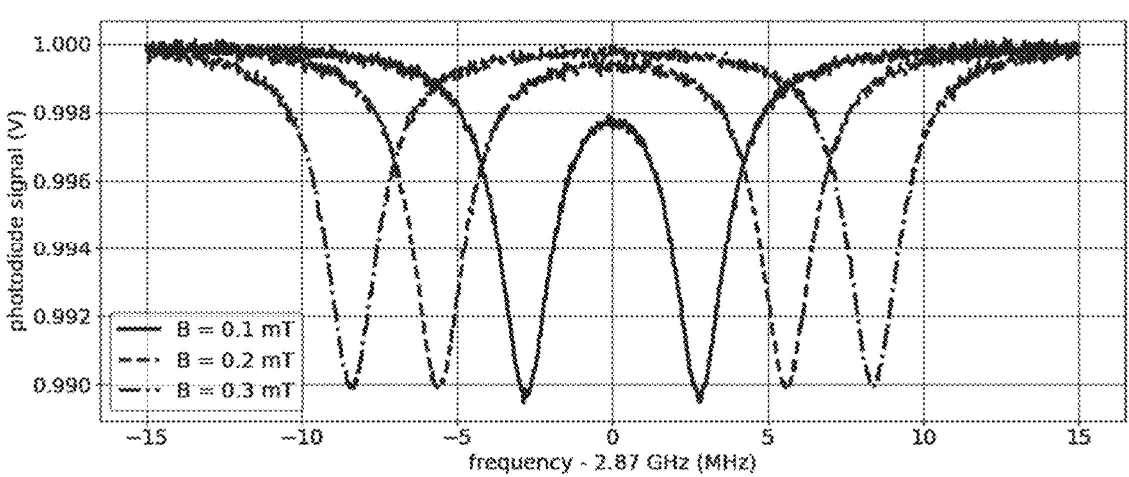
FIG. 3 is a graph of ODMR (Optically Detected Magnetic Resonance) data obtained by measuring the red fluorescence for different magnetic field values.

FIG. 3 is a graph of simulated ODMR data that can be obtained by measuring the red fluorescence for different magnetic field values. For each value of the magnetic field, the two resonance dips in the photodiode output signal and centered around the excitation frequency appear clearly. The spacing of the dips increases with the intensity of the magnetic field. Since the NV centers can exist in four different directions within the crystal, a total of four pairs of two resonances can actually be observed, each pair corresponding to a projection of the magnetic field vector onto a given direction of an NV axis. This allows to univocally identify the three spatial components of the magnetic field, and thus to obtain a vector measurement of the latter. The NV sensor allows an accurate vector measurement of a magnetic field, with a good sensitivity: the latter is often limited by the photon shot noise of the fluorescence light, reaching typical values ranging from pT/√Hz to nT/√Hz depending on the sensor design.

Figure 4:
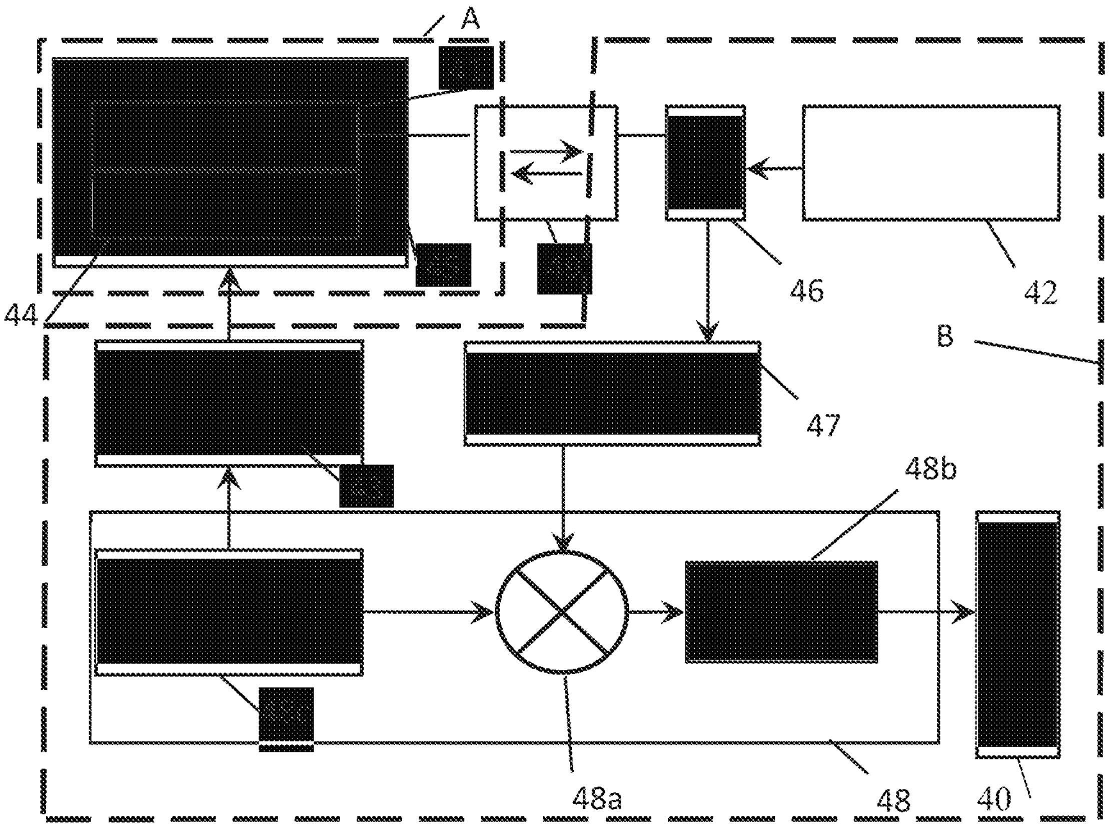
FIG. 4 is a block diagram of the components of an NV magnetometer according to an exemplary embodiment.

FIG. 4 is a block diagram of the components of a non-limiting exemplary embodiment of an NV magnetometer shown with the purpose of describing various components used therein. The device of FIG. 4 comprises two subsystems: sensor head A and excitation/readout/processing module B. In the device of FIG. 4, the same fiber is used both to carry the excitation light for the NV diamond and to collect the resulting fluorescence emitted by NV centers. However, according to other embodiments described later on, distinct fibers can be used to perform each of these functions.

According to one embodiment, the sensor head A comprises:

1. An NV diamond 41
2. An optical fiber associated with the NV diamond
3. A bias magnet 45

The magnetic bias may be provided by a permanent magnet for allowing to resolve the different magnetic resonances. A typical value of the bias field is around 30 mT, but this value is given purely as a non-limiting example. Other types of sources of a continuous magnetic field, such as a coil, micro Helmholtz coils or a Halbach array may also be used.

4. A microwave resonator 44

The resonator ensures a sufficiently strong coupling between the NV electronic spins and a microwave magnetic field provided by a microwave source 43. As a non-limiting example, microwave magnetic field amplitudes of a few $10^{-4}$T can typically be used. Depending on the application, the resonator can be for example a printed circuit board-based resonator or broadband antenna, or a wire antenna made with copper.

5. As necessary, a substrate and/or mechanical components e.g. a housing for holding the diamond, the microwave resonator, the fiber and the magnet.

According to one embodiment, the excitation/readout/processing module B comprises:

6. A green light source 42

This light source may be a laser or a LED, for example with a power in the range 1-100 mW at the wavelength in the range 510-550 nm and stabilized in power to ensure low enough relative intensity noise (RIN) level.

7. A microwave source 43, the tunable frequency of which is around 2.87 GHz, coupled to microwave resonator 44. The microwave source is driven by a local oscillator 48*c*.
8. A green/red light separator 46

A green/red light separator 46 is used to separate the green light being injected into the optical fiber and the fluorescence emitted by the NV centers and having a wavelength at around 650 nm. The red fluorescence is re-emitted into the same fiber that also carries the green excitation light provided by source 42, hence the use of the separator, which can be a dichroic optical element or any optical system that can separate the green and red light.

As will be described in detail later, some embodiments do not require a green/red light separator.

9. A photodetector 47

In the present embodiment, the photodetector 47 is a photodiode, although other photodetectors may be used. The photodiode is used to detect the red light received as output from separator 46. The photodiode can be used in conjunction with a transimpedance amplifier (not shown) to generate a voltage based on the photodiode output and to feed the next stage.

10. A lock-in amplifier 48

The lock-in amplifier receives the signal from the photodiode 47 and its associated amplification means. The lock-in amplifier comprises a mixer 48*a* and a low-pass filter 48*b*. The mixer 48*a* is driven by local oscillator 48*c*, which according to one non-limiting embodiment is part of the lock-on amplifier.

11. A processor 40

The processor may advantageously be located remotely compared to the sensor head A. It acquires and processes the information provided by the lock-in amplifier. It is also used to control a user interface for communication with the user. The processor executes software code stored in a memory (not shown). The processor is part of a control module which may comprise other components. According to certain embodiments, the processor processes signals provided by a plurality of photodiodes.

The sensor head A and the excitation/readout/processing module B are connected through a connection module 49, the role of which is to optically connect the modules A and B, either directly or through one or more appropriately placed connectors.

According to an embodiment, the microwave source and the microwave resonator are connected through a cable e.g. running in parallel with the optical fiber. According to a variant embodiment, the connection module comprises one or more amplifiers for amplifying the microwave signal along the cable.

According to another embodiment, the microwave source produces microwaves that are optically transmitted and regenerated locally before being transmitted to the resonator.

In the present embodiment, the measurement of the magnetic field is performed via the lock-in amplifier and is based on a frequency modulation (FM) spectroscopy technique. The microwave signal generated by microwave source 43 is frequency modulated. The frequency fLO used for this frequency modulation may for example be 100 KHz. This in turn modulates the level of red fluorescence around the minimum of the resonance curve at the same frequency. The signal output from the photodiode is therefore modulated at fLO. The lock-in amplifier performs a synchronous detection by electronically mixing the signal coming from the photodiode with the local oscillator (LO) signal and by keeping only the slowly evolving part of the resulting signal, e.g. by applying low pass filter 48*b*. The resulting signal output from the lock-in amplifier is proportional to the derivative of the resonance and corresponds to a dispersive curve with a linear part that allows to translate the measured voltage into a frequency and therefore into a magnetic field value according to (see Eq. 1 above).

Various features of a coupler device that can be used e.g. within sensor head such as sensor head A will now be described. Each feature provides a distinct improvement of the efficiency of light collection and can be used in isolation or in combination with one, or several, or all other features. Certain combinations of features can however present distinct synergies and advantages.

Figure 5:
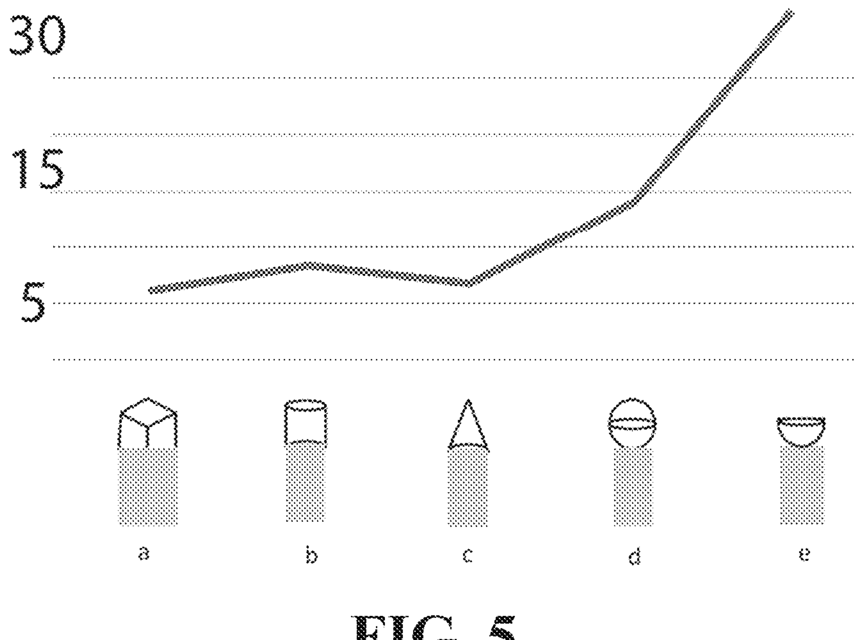
FIG. 5 is a graph illustrating fluorescence collection efficiency for different diamond shapes.

According to a first feature, an advantageous shape of the NV diamond or of a lens fixed to the NV diamond is determined. To this end, different diamond shapes were simulated with regard to the collection efficiency attained when attached to a fiber. The results of the simulation, in which the core size of the fiber was 400 μm with a numerical aperture of 0.5, are shown in FIG. 5. Letters 'a' to 'e' respectively designate the following shapes: a cube, a cylinder, a cone, a sphere and a half-sphere with a Weierstrass-like geometry. The latter provided the best performance, with a collection efficiency of up to 31.3% for the NV centers that are excited in the middle of the diamond within a proximity of 80 μm. The relatively high collection efficiency is the result of preventing rays from travelling around the concave surface of the diamond—such rays are also known as 'whispering gallery' rays—and forcing most of the rays coming from the NV centers inside the diamond to end up being perpendicular to the surface of the structure. The Weierstrass geometry has also been studied when coated with a reflective coating on the back of the substrate—this further increased the collection efficiency to 35.8%. It has been shown that a half-sphere diamond shape has a performance similar to that of a Weierstrass shape and can be used instead. This avoids the manufacturing cost of turning a diamond into a Weierstass shape, resulting in less material loss and an easier process. Both lenses are collectively known as solid-immersion lenses (i.e. a lens with a half-sphere or Weierstrass shape, where the fluorescent emitter is located inside a material of similar index as the lens).

Figure 6:
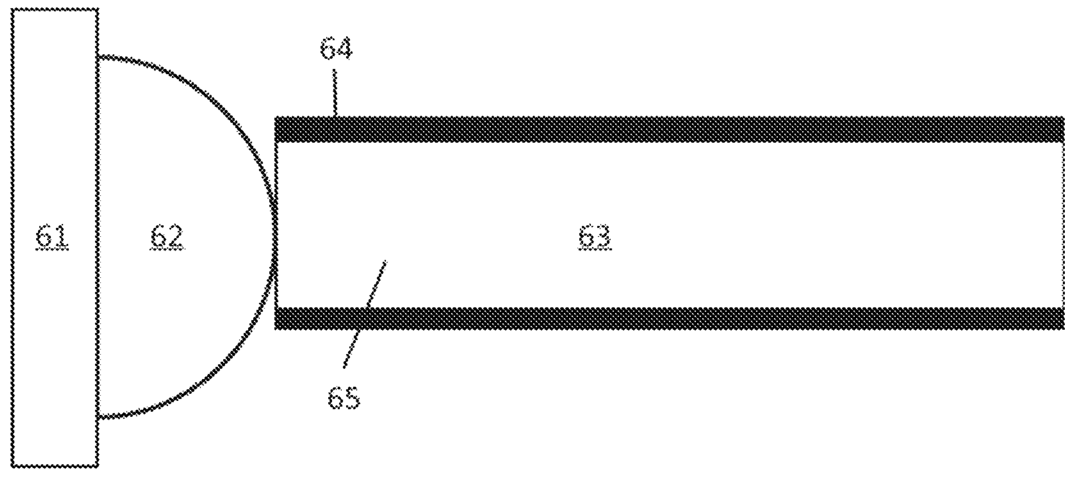
FIG. 6 is a schematic diagram of a diamond/lens assembly according to a non-limiting exemplary embodiment.

In order to obtain an appropriate shape for the diamond, the latter may be appropriately polished or otherwise shaped using processes known to the person skilled in the art. However, it is also possible to combine a diamond with an appropriate lens made of a refractive material other than diamond like zinc selenide or lanthanum (S-LAH79). Typically, a material with a refractive index between 1.9 and 2.8 can be used. The lens is then placed on the diamond, which can for example be a flat disc or rectangle. FIG. 6 is a schematic diagram illustrating the case in which a lens is attached to the diamond. In the illustrated example, a diamond 61 is placed against the flat section of a lens 62. An optical fiber 63 with cladding 64 and a core 65 is attached to a half-sphere or Weierstrass lens placed on top of a diamond. To provide an example of components sizes used in the test equipment, the NV diamond was a DNVB-1 diamond available from 'Element 6' and was a flat square with a size of 3×3×0.5 mm3, the core had a diameter of 1.5 mm and the half-sphere lens had a diameter of 2 mm. The fiber was a commercially available Thorlabs FP400URT fiber with NA=0.5 and a core size of 400 μm. The lens was a 2 mm S-LAH79 half-sphere lens also from Thorlabs. Actual measurement results are shown in Table 1, for various combinations of fiber core size, presence or absence of a half-sphere lens and diamond coating. The coating will advantageously increase the excitation by reflection of the green laser light on the coating. The measurements show that adding a coating may enhance the collection efficiency by a factor of more than two. The collection efficiency is the ratio between the measured intensity of fluorescence to the total intensity of this fluorescence.

TABLE 1

| Structure | Measured Fluorescence (Volts) |
|---|---|
| 200 μm core fiber | 0.17 |
| 1000 μm core fiber | 0.8 |
| 1000 μm core fiber + half-sphere lens | 1.6 |
| 1000 μm core fiber + coating | 3.5 |
| 1000 μm core fiber + half-sphere lens + coating | 5.1 |

Figures 7, 8A:
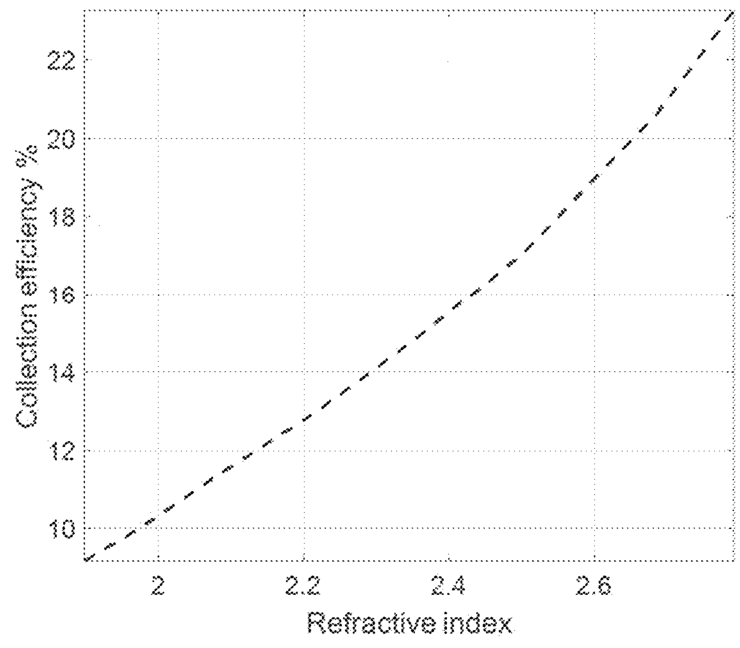
FIG. 7 is a chart plotting the collection efficiency in percentage as a function of the refractive index of the lens material.

FIG. 7 is a graph plotting the collection efficiency in percentage as a function of the refractive index of the lens material.

Preferably, the lens and the diamond are both flat at their contact surface to ensure a good optical contact. If the surface of e.g. the diamond were rough, the optical indices would not be matched and this could induce non-controlled reflections.

Preferably, the diamond has a size that at least matches the bottom of the lens, so that all of the green excitation light is received by the diamond. Only the excited part of the diamond emits fluorescence. The diamond can be larger, for example for easier handling or device manufacturing requirements.

Preferably, the lens is matched to the optical beam, so that all of the excitation light beam is guided by the lens to the diamond.

According to a variant embodiment, a mirror is used instead of a reflective coating.

According to a second feature, a reflector is used. The diamond is placed within the reflector to further enhance the collection efficiency by collecting fluorescence from all sides of the diamond. In case a lens is attached to the diamond, both are placed within the reflector, so as to enable collection of the fluorescence from all sides of the high refractive index media, i.e. the diamond. Simulations show that a reflector may further enhance the collection efficiency by 63%.

Figure 8B:
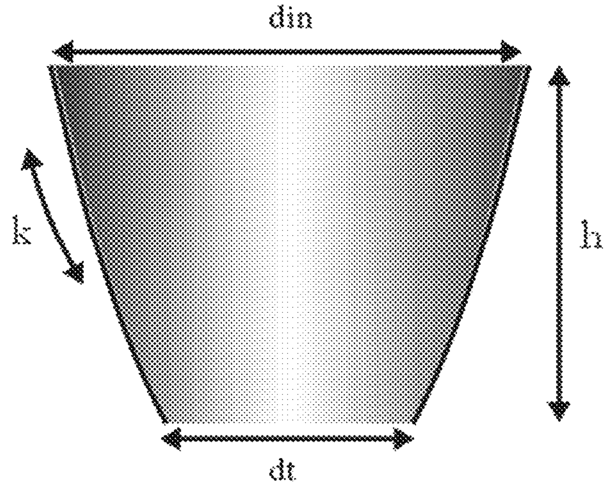
FIG. 8 (*a*) and (*b*) are cuts of different reflector shapes according to some non-limiting exemplary embodiments.

FIG. 8*a* and FIG. 8*b* respectively show reflector shapes that can be placed around the diamond or the diamond/lens combination according to non-limiting exemplary embodiments. The shapes include (a) a simple cone and (b) a standard surface.

(a) The conical reflector is defined by the following parameters:
 an input diameter ($d_{in}$),
 a termination diameter of ($d_t$), and
 a height (h).

(b) The z coordinate of the standard surface reflector follows equation (1):

$$z = \frac{cr^2}{1 + \sqrt{1 - (1 + k)c^2 r^2}} \tag{1}$$

where c represents the curvature, k is the conic constant, and r is the radial coordinate.

Figure 9:
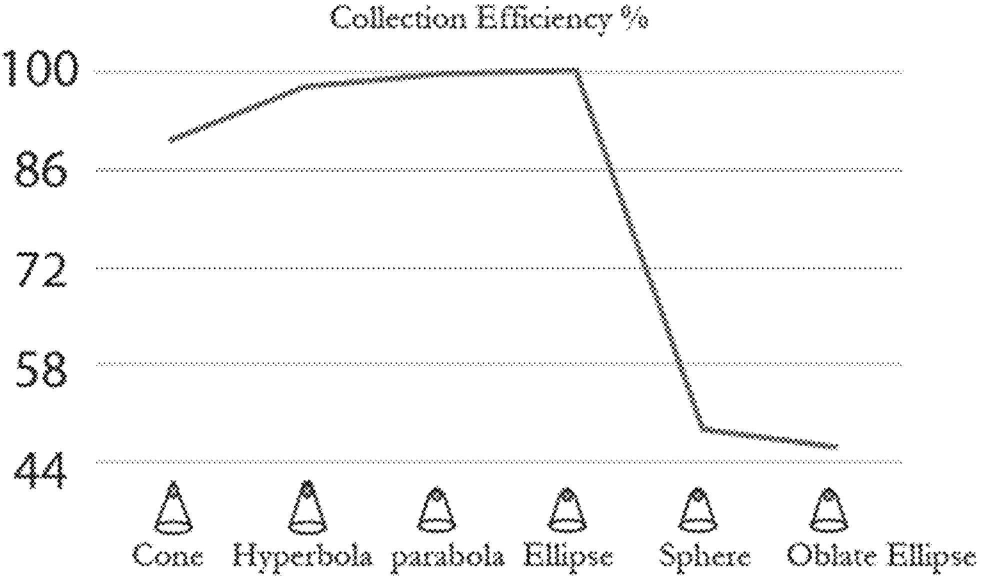
FIG. 9 is a chart plotting simulated collection efficiencies for standard shape reflectors with different conic constant values compared to the collection efficiency of a truncated cone reflector.

Depending on the conic constant, the standard surface of the reflector will represent a parabola for k=−1, an ellipse for −1<k<1 or a sphere for k=0. Such reflectors are optimized for the collection and excitation efficiency of the enclosed diamond attached to the fiber using five parameters including the input diameter ($d_{in}$), the termination diameter ($d_t$), the height (H), the conic constant (k) and the radius (r) that will define the curvature of the reflector. Reflectors with different values of the conic constant for the standard surface have been examined. FIG. 9 is a chart plotting the simulated collection efficiency of standard surface reflectors with various conical constants compared to that of a cone. In this exemplary setup, the reflectors are coupled to a fiber with core diameter 2.5 times smaller than the input diameter of the reflector ($d_{in}$=1 mm in this case). For the simulations, the fiber core size was chosen to be 400 μm, with a numerical aperture of 0.5. The simulations show that the elliptical and parabolic reflector have a collection efficiency of more than 99% compared to more than 90% for the reflector with a truncated cone cross-section. Depending on the targeted application, manufacturing and polishing of an elliptical or parabolical reflector may not be cost-efficient. In such cases, using a simple truncated cone of revolution instead still provides a high collection efficiency of more than 90%.

According to a variant embodiment, in order to maintain high excitation efficiency when the excitation light of the diamond is conveyed by the same fiber that also collects the fluorescence, the value of the optical fiber core size is chosen to be substantially the same as the input diameter of the reflector. In such a case, it has been calculated that the excitation efficiency for the parabola and conical reflector are 72% and 68%, respectively, with d_t=0.2 mm and d_in=1 mm.

According to a variant embodiment, a flat diamond is placed within a reflector, wherein the diamond is not provided with a lens.

According to a third feature, the diamond is partially coated with a reflective coating on the back side and edges. This coating is applied to enhance reflection of the fluorescence towards the collecting fiber. The coating also improves reflection of excitation light within the diamond, excitation light which would else be lost.

According to one embodiment, a reflective coating is applied to one or more sides of the diamond to enhance collection and excitation. In the example where the diamond is flat, the coating is applied at least to the back side, the backside being the side of the diamond facing away from the collection fiber, to ensure the light trying to escape from the backside of the diamond is collected and the excitation is applied efficiently. The backside coating will not only enhance the collection efficiency by around 5% but also will improve the excitation efficiency as the excitation light will be reflected at least once more inside the diamond. The reflective coating of the diamond should be as thin as possible to guarantee efficient microwave excitation for the NV sensing application. Different coatings materials with a thickness of 50 nm on a diamond of 500 μm thickness have been studied using the Fresnel equation.

Figure 10:
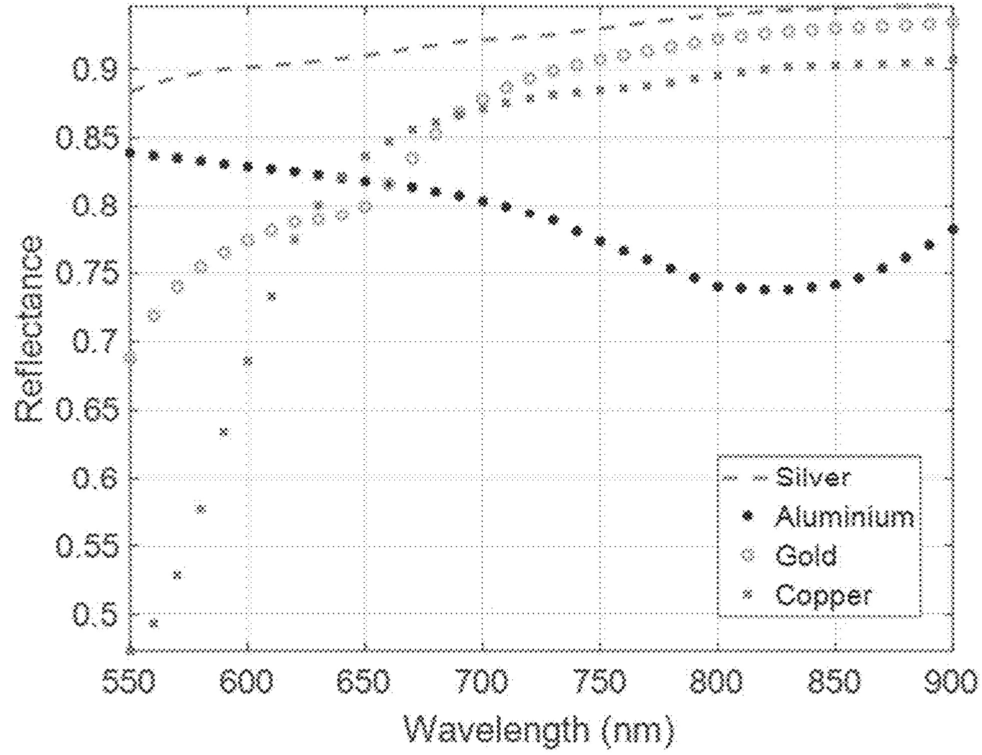
FIG. 10 is a graph showing the reflectance of coatings as a function of light wavelength for four different metals.

FIG. 10 is a graph showing the reflectance of coatings as a function of light wavelength for four different metals. According to the simulation results, a silver coating provides the highest reflectance. Copper coating is found to be preferred and more beneficial as it will reflect only NV-fluorescence and not the unwanted NVO fluorescence that starts around 550 nm with the zero-phonon line at 575 nm.

According to a fourth feature, separate waveguides are used for excitation and collection.

The high collection and excitation efficiency of the proposed conical structure using the same fiber for both excitation and collection is simple, but still requires a relatively bulky optical setup including a dichroic filter to separate the red fluorescence and the exciting green laser light. To solve this problem, it is proposed to use separate fibers for excitation and collection.

According to one embodiment illustrated by FIGS. 11*a* to 11*d*, two fibers are used. In the setup of FIG. 11, a Weierstrass lens is attached to an NV diamond 1101—the backside of the NV diamond is coated with a reflective coating 1107. Fiber 1103 is used for collection, whereas fiber 1106 is used for excitation.

According to a variant embodiment, the fiber used for the collection has a bigger core size than the fiber used for excitation.

The excitation fiber can illuminate the diamond or the diamond/lens combination at various locations, depending on the requirements of a specific application. According to one embodiment, the excitation fiber approaches the surface of the lens 1102 towards the top of the lens. According to another embodiment, the excitation fiber illuminates a side of the NV diamond. The inventors have experimentally shown that exciting from the side of the diamond results in 4.5 times more fluorescence signal than exciting from the top as shown respectively in FIGS. 11*a* and 11*b*.

Figure 11A:
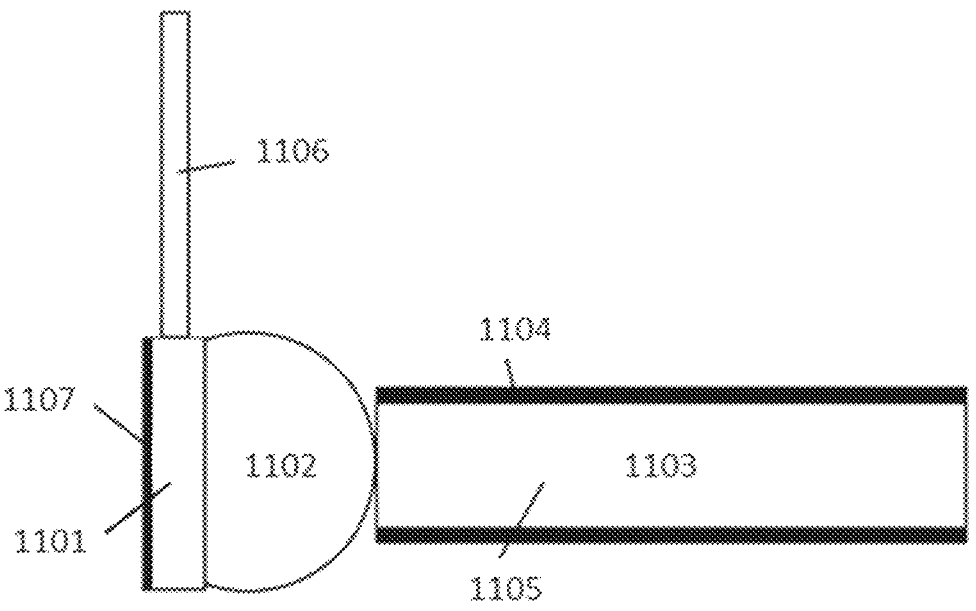
FIG. 11*a* and FIG. 11*b* are schematic diagrams illustrating different excitation light illumination locations according to a non-limiting exemplary embodiment.
Figure 11B:
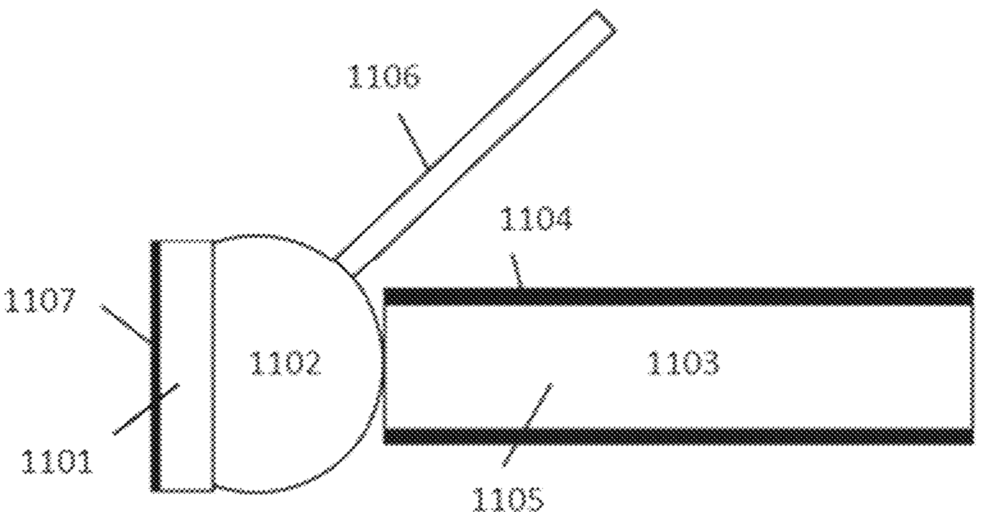
Figure 11C:
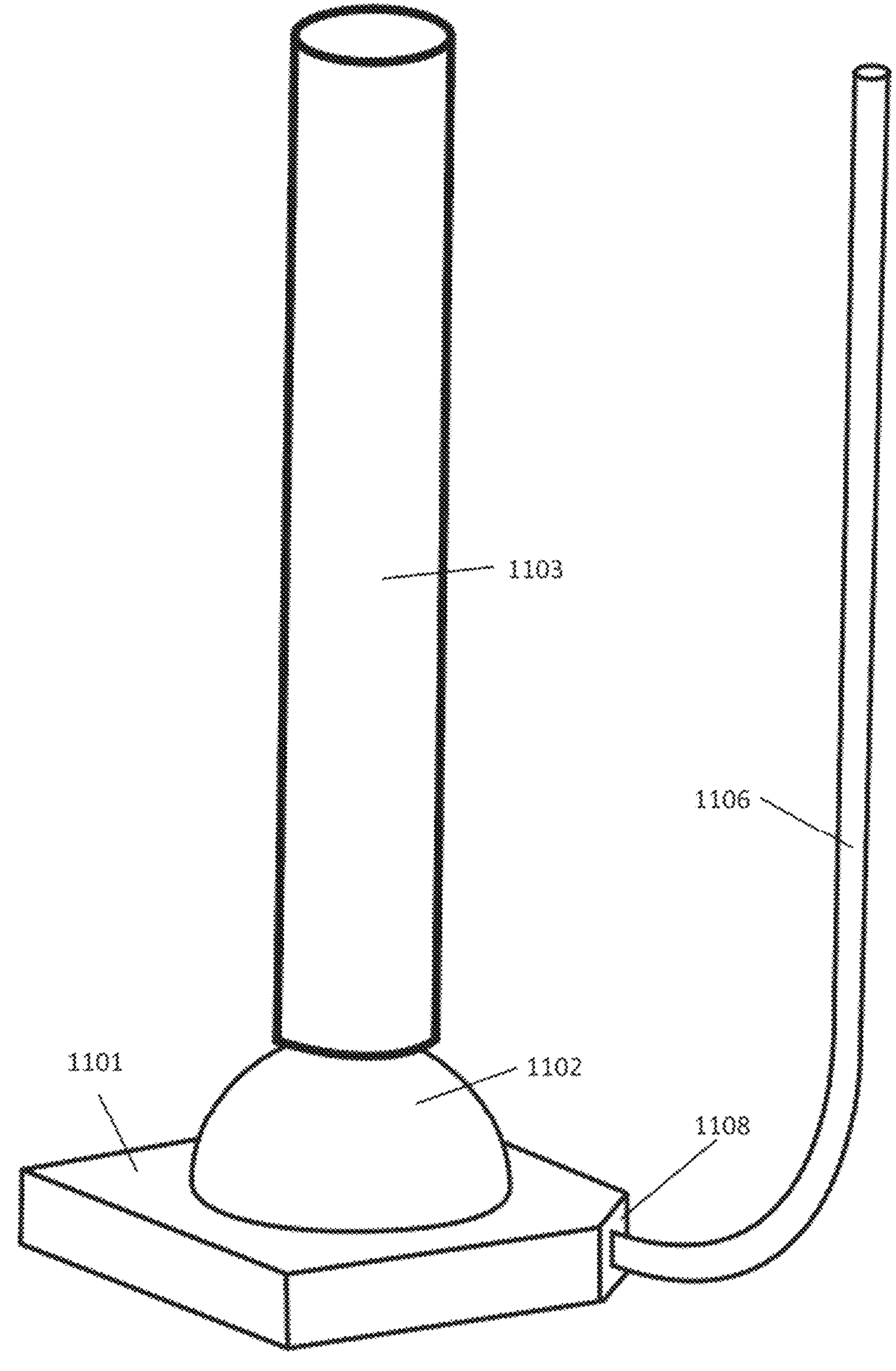
FIG. 11*c* is a schematic diagram illustrating excitation from the side of the diamond and collection from the top of a half ball lens, according to one non-limiting exemplary embodiment.

According to a variant embodiment illustrated by FIG. 11*c*, an edge of the square diamond is cut by 45 degrees and a fiber is attached to the surface generated through the cut for excitation. This further enhances the excitation as the diamond will behave like a waveguide making the light travel all around the diamond and exciting more NV centers. In this case, the light will only go out if it is incident to the plane of the cut.

In the experiment, the side excitation was performed using a 200 μm fiber core size that was perpendicular to the side of the diamond, while a 1 mm fiber core size was used for illuminating the half-sphere lens from the top.

Figure 11D:
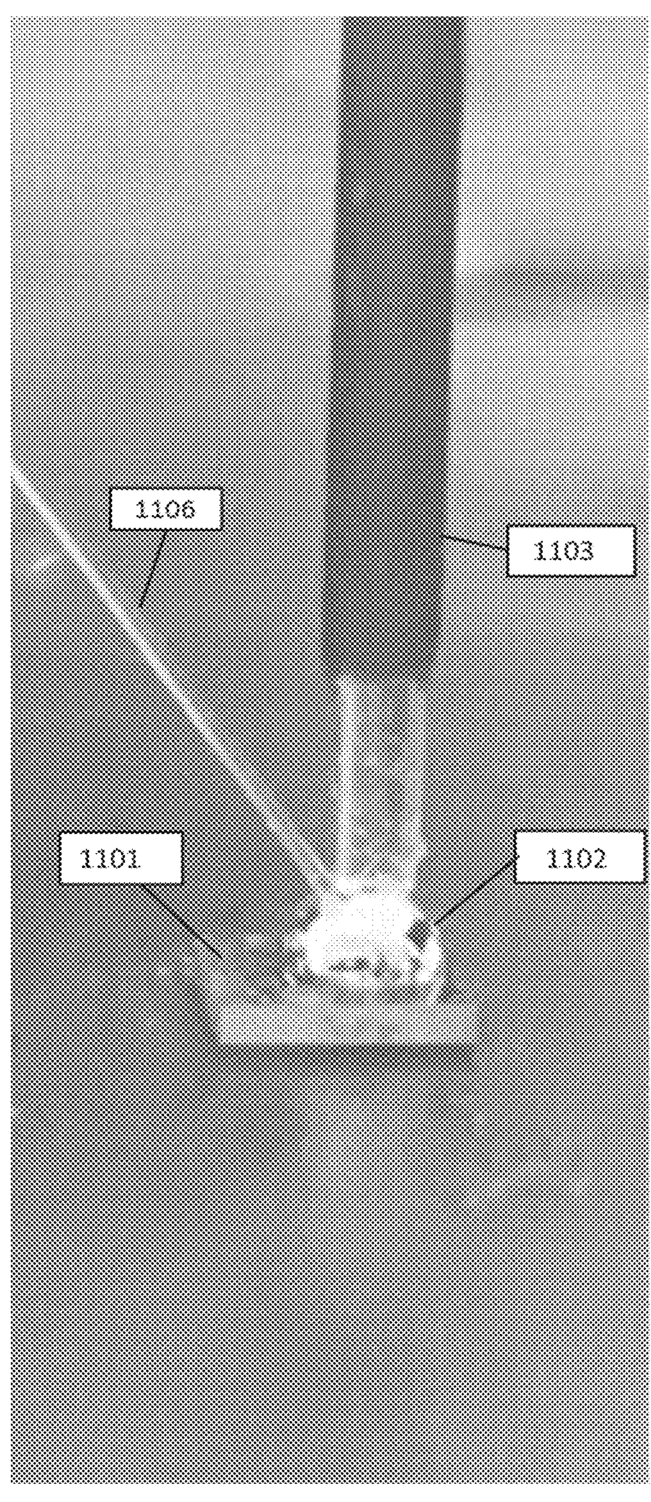
FIG. 11*d* is a photography of an experimental setup corresponding to FIG. 11*b;*

FIG. 11*d* shows the experimental top excitation setup. A 1 mm collection fiber is fixed to the half-sphere lens, while the excitation fiber arrives on the half-sphere lens with an angle of substantially 30 degrees compared to the axis of the lens. Although it was observed that the side excitation is two times less efficient than when exciting and collecting from the same fiber, the sensor is simpler and integration is easier, in particular because there is no need to use a dichroic filter.

Figure 12:
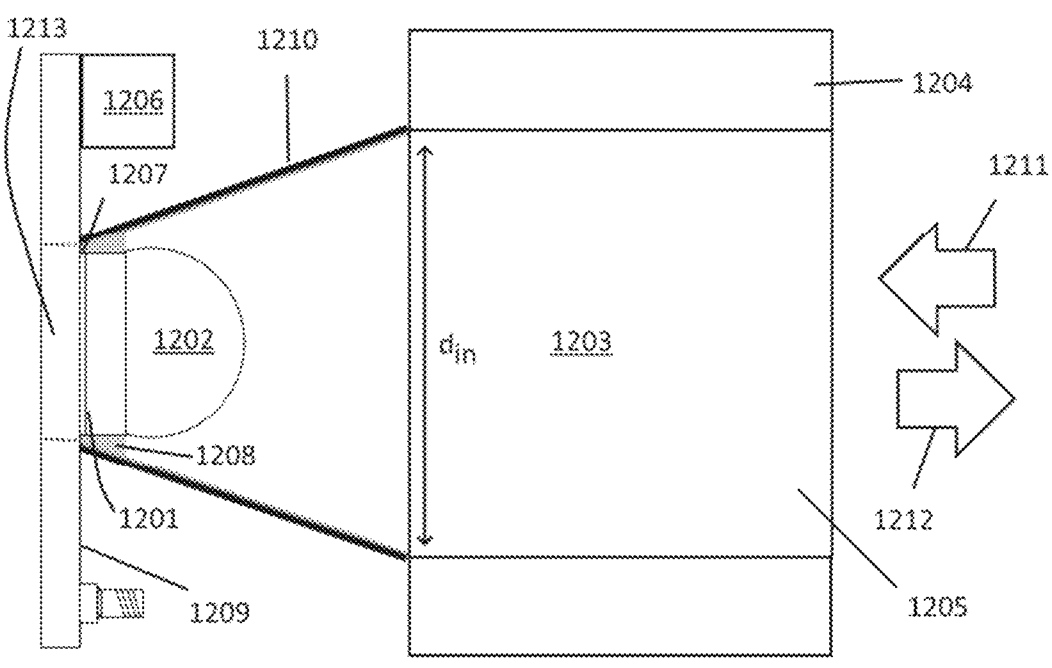
FIG. 12 is a schematic diagram of a non-limiting exemplary embodiment of a sensor head using a single fiber for excitation and collection.
Figure 13:
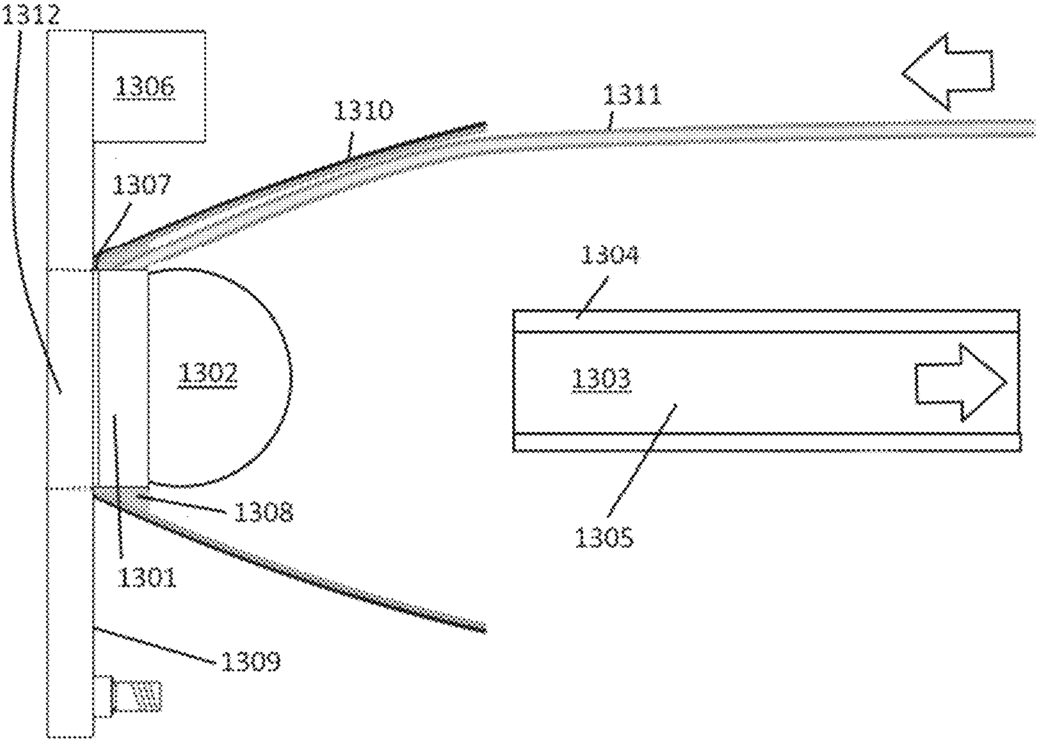
FIG. 13 are schematic diagrams of a non-limiting exemplary embodiment of a sensor head using separate fibers for excitation and collection.

FIG. 12 and FIG. 13 are schematic diagrams of a sensor head according to two non-limiting exemplary embodiments.

The sensor head of FIG. 12 comprises a reflector 1210 with a truncated conical shape and a single fiber 1203 for both excitation and collection. A solid immersion lens 1202 is attached to diamond 1201, which is provided with a reflective coating on its side directed away from fiber 1203. The diamond and lens assembly are fixed to the inner walls of the narrow end of reflector by appropriate means such as glue 1207, so that the diamond is close to the termination aperture of the reflector and thus close to the sample to be measured. The sensor head further comprises a microwave excitation circuit, in the present example in the form of a microstrip antenna placed on substrate 1209. The sensor head can be mounted close to the sample and the diamond can measure the sample through an opening 1213 of substrate 1209. A bias magnet 1206 is fixed to substrate 1209 close to the diamond. Fiber 1203 possesses a cladding 1204 and a core 1205, the diameter of the latter is chosen to be substantially the same as the input diameter $d_{in}$ of reflector 1210. Fiber 1203 is used for guiding both the excitation light 1211 and the collected fluorescence 1212. The sensor head also comprises a housing (not shown in FIG. 12) for holding the different components and maintaining them in place.

Exemplary dimensions of some of the above elements can be, in the case of a conical reflector shape, a diamond having a width and a length of 200 μm, and a depth of 500 μm associated with a cone reflector with the following parameters: H=0.86 mm, d_in=1 mm, and d_t=200 μm. In the case of a parabolic reflector shape, parameters can for example be k=−1, r=0.15 mm, and H=0.87 mm, d_in=1 mm, d_t=200 μm. For a diamond of 2 mm×2 mm×0.5 mm, which is a commercially available size, the optimized parameters can be: k=−1, r=0.586 mm, H=3.6 mm, d_in=5 mm, and d_t=2.22 mm. This optimization was obtained through simulation by varying the parameters within certain value ranges to reach the highest collection intensity, using an appropriate software such as the one available from Zemax.

The sensor head of FIG. 13 comprises a reflector with a standard surface shape and distinct fibers for excitation and collection.

The sensor head also comprises a housing (not shown) for holding the different components and maintaining them in place. The sensor head of FIG. 13 comprises a reflector 1310 with a standard surface shape, associated with an excitation fiber 1311 and a collection fiber 1303. A solid immersion lens 1302 is attached to diamond 1301, which is provided with a reflective coating on its side directed away from fiber 1303. The diamond and lens assembly are fixed to the inner walls of the narrow end of reflector by appropriate means such as glue 1307, so that the diamond is close to the termination aperture of the reflector and thus close to the sample to be measured. The sensor head further comprises a microwave excitation circuit, in the present example in the form of a microstrip antenna placed on substrate 1309. The sensor head can be mounted close to the sample and the diamond can measure the sample through an opening 1313 of substrate 1309. A bias magnet 1306 is fixed to substrate 1309 close to the diamond. Fibers 1303 and 1311 both possess a cladding and a core, with those of fiber 1303 respectively referenced 1304 and 1305. In the exemplary embodiment illustrated by FIG. 13, the excitation fiber runs along the inner side of the wall of reflector 1310 towards diamond 1301. Other implementation may see the excitation fiber be arranged different, e.g. external to the reflector and arriving on the diamond through a hole in the reflector wall, or again internal to the reflector, but arriving on the lens 1302, as previously described. The person skilled in the art may easily devise other implementations.

The exemplary parameters mentioned in relation with the embodiment of FIG. 12 can also be used for the embodiment of FIG. 13, except that, in that case, the size of the fiber core for the collection fiber is chosen, for example, to be substantially the same or larger than the diamond size, while leaving space for the other slanted fiber to run along the internal wall of the reflector for excitation from the side. According to one embodiment, the size of the collection fiber is chosen so as to provide an image of the entire diamond.

The excitation fiber core size in this case can be chosen to be for example of a few micrometers, so that it is possible to bend the fiber to run along the reflector inner wall and to position its extremity to excite the diamond from the side. Variant implementations can use larger cores (e.g. when the excitation fiber arrives on top of the diamond/lens assembly as previously described) and/or a plurality of excitation fibers.

In both exemplary embodiments of FIG. 12 and FIG. 13, the microwave resonator is for example a double split ring resonator, with the inner ring surrounding openings 1213 and 1312. The embodiments of FIG. 12 and FIG. 13 can be simplified by removing the lens 1202, 1302 with some impact on the collection efficiency, which nevertheless remains higher than the known solutions (without the associated reflector).

Figure 14:
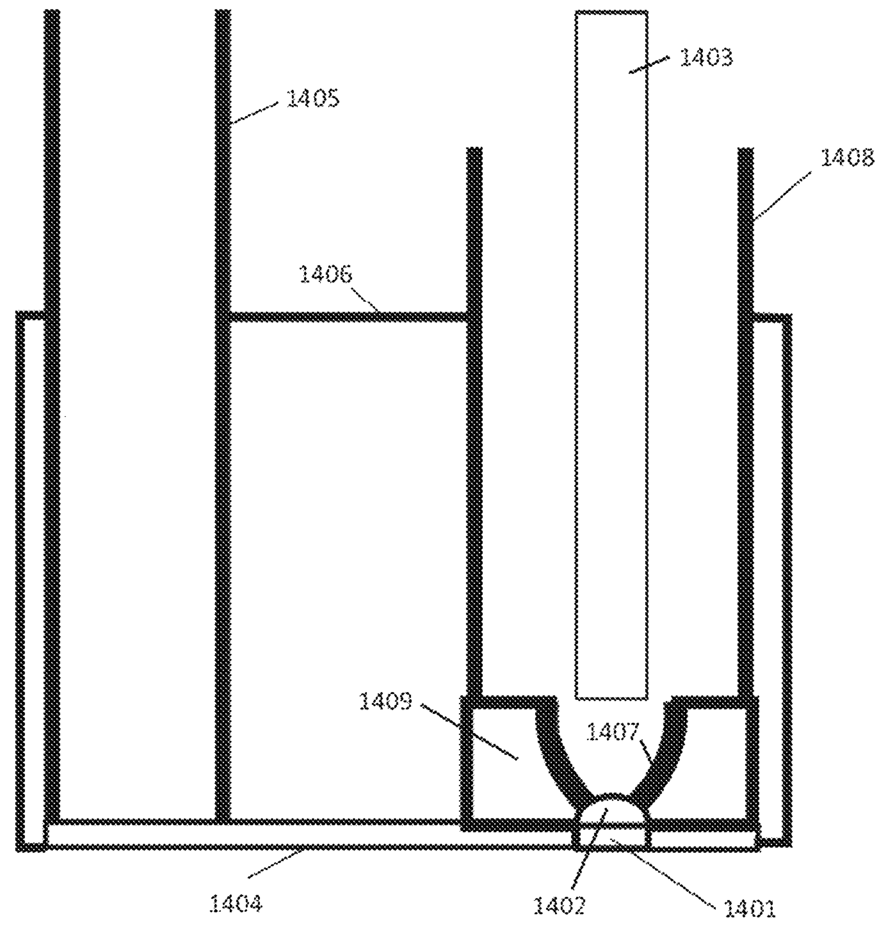
FIG. 14 is a schematic diagram of a sensor head according to a non-limiting exemplary embodiment.

FIG. 14 is a schematic diagram of an exemplary sensor head comprising a housing 1406 that holds in place fiber 1403 and microwave cable 1405. Other components shown in FIG. 14 comprise a microwave antenna 1404 on a substrate and connected to the microwave cable 1405, a diamond 1401 and lens 1402, a reflector 1407 and a protective sheath 1408. In addition to the housing, various mechanical and chemical means may be used to hold components in place, such as reflector mount 1409. The microwave cable may be connected to the microwave antenna substrate using an appropriate radio-frequency connector.

The different sensor implementations as described can advantageously use commercially available optical fibers.

While in the above exemplary embodiments, the NV diamond is coated only on the backside, in the frame of other embodiments, it can be coated on any part of the surface if not interfering with excitation and collection. E.g. when a single fiber is used for both excitation and collection, then all sides may be coated except the side facing the fiber. When the diamond has a cuboid shape, the backside and the four lateral sides would be coated. When distinct fibers are used for excitation and collection, the part of the diamond surface on which the fiber arrives would be left without coating. In the embodiment in which the excitation fiber arrives on the side of the diamond, only the part of that side receiving light from the fiber would be left uncoated.

While in the above exemplary embodiments, nitrogen vacancy diamonds are used as source of light to be collected, other types of material may be used. This comprises but is not limited to materials that produce fluorescence under certain conditions, including diamonds with different color centers than nitrogen-vacancy, such as silicon-vacancy (SiV), germanium-vacancy (GeV) or tin-vacancy (SnV).

| References to the Drawings | |
|---|---|
| 40 | Microprocessor |
| 41 | NV diamond crystal |
| 42 | Green light source |
| 43 | Microwave source |
| 44 | Microwave resonator |
| 45 | Bias magnet |
| 46 | Green/red light separator |
| 47 | Photodetector |
| 48 | Lock-in amplifier |
| 48a | Mixer |
| 48b | Low pass filter |
| 48c | Local oscillator |
| 49 | Connection module |
| 61 | NV diamond |
| 62 | Lens |
| 63 | Fiber |
| 64 | Fiber cladding |
| 65 | Fiber core |
| 1101 | NV diamond |
| 1102 | Lens |
| 1103 | Collection fiber |
| 1104 | Collection fiber core |
| 1105 | Collection fiber cladding |
| 1106 | Excitation fiber |
| 1107 | Reflective coating |
| 1108 | Cut edge |
| 1201 | NV diamond |
| 1202 | Lens |
| 1203 | Fiber |
| 1204 | Fiber cladding |
| 1205 | Fiber core |
| 1206 | Bias magnet |
| 1207 | Reflective coating |
| 1208 | Glue |
| 1209 | Microwave antenna circuit board |
| 1210 | Reflector |
| 1211 | Excitation light |
| 1212 | Collected fluorescence |
| 1213 | Opening |
| 1301 | NV diamond |
| 1302 | Lens |
| 1303 | Collection fiber |
| 1304 | Collection fiber cladding |
| 1305 | Collection fiber core |
| 1306 | Bias magnet |
| 1307 | Reflective coating |
| 1308 | Glue |
| 1309 | Microwave antenna circuit board |
| 1310 | Reflector |
| 1311 | Excitation fiber |
| 1312 | Opening |
| 1401 | NV diamond |
| 1402 | Lens |
| 1403 | Fiber |
| 1404 | Microwave resonator and substrate |
| 1405 | Microwave cable |
| 1406 | Housing |
| 1407 | Reflector |
| 1408 | Protective sheath |
| 1409 | Reflector mount |

The invention claimed is:

1. A sensor device comprising:

a source of fluorescence comprises a nitrogen-vacancy diamond, wherein said fluorescence is function of a physical phenomenon to be sensed, said physical phenomenon being a magnetic field, and wherein said fluorescence is generated in response to an excitation provided by a source of excitation, said excitation being a light in the green spectrum produced by an excitation light source;

a collector for collecting said fluorescence;

a reflector placed around said source of fluorescence to reflect said fluorescence towards said collector, wherein said reflector is provided with an opening at its vertex, the source of fluorescence being arranged within said reflector to sense said physical phenomenon through said opening.

2. Sensor device according to claim 1, wherein said nitrogen-vacancy diamond has the shape of a solid-immersion lens.

3. Sensor device according to claim 1, wherein said source further comprises a lens associated with said nitrogen-vacancy diamond, wherein said lens has the shape of a solid-immersion lens.

4. Sensor device according to claim 1, wherein a side of the nitrogen-vacancy diamond facing said opening is coated with a reflective coating, a material of said reflective coating being selected so as to reflect both fluorescence and excitation light.

5. Sensor device according to claim 4, wherein said coating comprises copper.

6. Sensor device according to claim 1, wherein said collector is a first optical fiber.

7. Sensor device according to claim 6, wherein said first optical fiber is arranged to channel said excitation light to said nitrogen-vacancy diamond.

8. Sensor device according to claim 6, further comprising a second optical fiber distinct from said first optical fiber, wherein said second optical fiber is arranged to channel said excitation light to said nitrogen-vacancy diamond.

9. Sensor device according to claim 8, wherein said second optical fiber is arranged to illuminate said nitrogen-vacancy diamond from a direction substantially perpendicular to the optical axis of the reflector.

10. Sensor device according to claim 8, wherein said nitrogen-vacancy diamond has the shape of a solid-immersion lens, wherein said second optical fiber is arranged to illuminate said solid immersion lens at an angle of substantially 30° compared to the optical axis of the solid immersion lens.

11. Sensor device according to claim 1, wherein said reflector has the shape of a truncated cone or the shape of a truncated standard surface.

12. Sensor device according to claim 6, wherein when the reflector has the shape of a truncated cone, the diameter of the core of the first optical fiber is substantially the same as the input diameter (din) of said truncated cone.

13. Sensor device according to claim 2, further comprising a microwave resonator placed on a substrate, said substrate comprising an opening substantially aligned with the opening of the reflector.

14. Magnetometer comprising a sensor device according to claim 1.

15. A sensor device comprising:

a source of fluorescence comprises a diamond with a vacancy center, wherein said fluorescence is function of a physical phenomenon to be sensed, said physical phenomenon being a magnetic field, and wherein said fluorescence is generated in response to an excitation provided by a source of excitation, said excitation being a light produced by an excitation light source;

a collector for collecting said fluorescence;

a reflector placed around said source of fluorescence to reflect said fluorescence towards said collector, wherein said reflector is provided with an opening at its vertex, the source of fluorescence being arranged within said reflector to sense said magnetic field through said opening.

* * * * *